United States Patent
Li

(10) Patent No.: US 11,239,443 B2
(45) Date of Patent: Feb. 1, 2022

(54) DISPLAY PANEL, METHOD FOR PREPARING THE SAME, AND DISPLAY DEVICE

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd, Beijing (CN)

( * ) Notice: Subject to any disclaimer, the term of this patent is extended or adjusted under 35 U.S.C. 154(b) by 0 days.

(21) Appl. No.: 16/860,404

(22) Filed: Apr. 28, 2020

(65) Prior Publication Data
US 2021/0126220 A1      Apr. 29, 2021

(30) Foreign Application Priority Data
Oct. 23, 2019 (CN) .......................... 201911011581.8

(51) Int. Cl.
  *H01L 51/52* (2006.01)
  *H01L 51/50* (2006.01)
  *H01L 51/56* (2006.01)

(52) U.S. Cl.
CPC ........ *H01L 51/5234* (2013.01); *H01L 51/502* (2013.01); *H01L 51/5056* (2013.01); *H01L 51/5268* (2013.01); *H01L 51/56* (2013.01); *H01L 2251/308* (2013.01)

(58) Field of Classification Search
CPC ............... H01L 51/5234; H01L 51/502; H01L 51/5268; H01L 2251/55
See application file for complete search history.

(56) References Cited

U.S. PATENT DOCUMENTS

2007/0077349 A1   4/2007   Newman et al.
2018/0019442 A1*  1/2018   Lal .......................... H01L 27/32

FOREIGN PATENT DOCUMENTS

CN       101288172 A    10/2008
CN       110137383 A    8/2019

OTHER PUBLICATIONS

Office Action for corresponding Chinese Application No. 201911011581.8 dated Sep. 9, 2021.

\* cited by examiner

*Primary Examiner* — Anthony Ho
(74) *Attorney, Agent, or Firm* — Arent Fox LLP; Michael Fainberg

(57) ABSTRACT

The present disclosure relates to a display panel, a method for preparing the same and a display device. The display panel includes a first electrode, a light emitting structure, a second electrode and a scattering layer stacked in sequence. The second electrode is a transparent electrode. One side of the scattering layer away from the second electrode is configured as a light emergent side. The surface of the one side of the scattering layer away from the second electrode is a rough surface, and the RMS of the roughness of the rough surface ranges from 50 nm to 200 nm.

16 Claims, 3 Drawing Sheets

DISPLAY PANEL, METHOD FOR PREPARING THE SAME, AND DISPLAY DEVICE

The present application claims priority to Chinese Patent Application No. 201911011581.8 filed with the Chinese Patent Office on Oct. 23, 2019, which is hereby incorporated by reference in its entirety.

FIELD

The present disclosure relates to the technical field of display, in particular to a display panel, a method for preparing the display panel, and a display device.

BACKGROUND

Serving as a novel light emitting material, a Quantum Dot (QD) has the advantages such as high color purity of light, high light emitting quantum efficiency, light emitting color adjustability and long service life so as to become a current research hotspot of a novel LED light emitting material. Therefore, a Quantum dot Light Emitting Diode (QLED) with a quantum dot material as a light emitting layer has become a main research direction of a novel display device at present.

SUMMARY

The present disclosure discloses a display panel, a method for preparing the display panel, and a display device.

The display panel includes a first electrode, a light emitting structure, a second electrode and a scattering layer stacked in sequence. The second electrode is a transparent electrode. One side of the scattering layer away from the second electrode is configured as a light emergent side. The surface of the one side of the scattering layer away from the second electrode is a rough surface, and the RMS of the roughness of the rough surface ranges from 50 nm to 200 nm.

The display device includes the above-mentioned display panel.

The method for preparing a display panel includes respectively preparing a first electrode, a light emitting structure, a second electrode and a scattering layer. The first electrode, the light emitting structure, the second electrode and the scattering layer are stacked in sequence. The second electrode is a transparent electrode. One side of the scattering layer away from the second electrode is configured as a light emergent side. The surface of the one side of the scattering layer away from the second electrode is a rough surface, and the RMS of the roughness of the rough surface ranges from 50 nm to 200 nm.

DETAILED DESCRIPTION OF THE EMBODIMENTS

Figure 1:
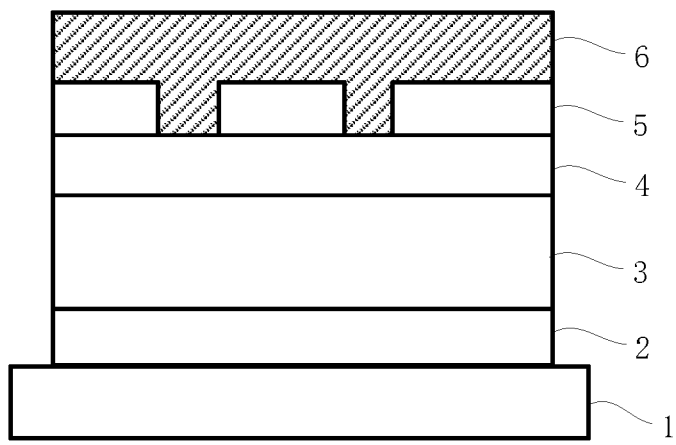
FIG. 1 is a schematic diagram of a sectional structure of a display panel provided by an embodiment of the present disclosure.

The technical solutions in the embodiments of the present disclosure will be clearly and completely described below in combination with the accompanying drawings in the embodiments of the present disclosure. Obviously, the described embodiments are not only a part of the embodiments of the present disclosure, but not all the embodiments. Based on the embodiments in the present disclosure, all other embodiments obtained by those of ordinary skill in the art without creative work shall fall within the protection scope of the present disclosure.

In the related art, for a QLED display product, a light emitting layer commonly adopts a top emission structure due to the demand of high resolution. In the top emission structure, a top electrode generally adopts a semitransparent electrode such as a thin film made of a metal such as Al and Ag. On one hand, the transmissivity of a thin film of thin metal is relatively low to affect the light emergent efficiency of the device; and on the other hand, a microcavity effect also makes the control of light extraction efficiency become very complex and is not beneficial to the improvement on light emergent efficiency.

As shown in FIG. 1, and FIG. 3 to FIG. 6, an embodiment of the present disclosure provides a display panel including a first electrode 2, a light emitting structure 3, a second electrode 4 and a scattering layer 5 stacked in sequence. The second electrode 4 is a transparent electrode. One side of the scattering layer 5 away from the second electrode 4 is configured as a light emergent side. The surface of the one side of the scattering layer 5 away from the second electrode 4 is a rough surface, and the RMS of the roughness of the rough surface ranges from 50 nm to 200 nm. Optionally, the transparent electrode refers to an electrode prepared by a transparent conductive oxide material such as indium tin oxide (ITO), indium zinc oxide (IZO) and fluorine-doped tin oxide (FTO).

In the above-mentioned display panel, the second electrode 4 is located at one side of the light emitting structure 3 away from a substrate 1 and is used as an electrode at the light emergent side. The second electrode 4 is made of a transparent electrode material so as to have higher transmissivity and light emergent efficiency than an electrode material made of a metal such as Al and Ag. Moreover, the light emergent side of the second electrode 4 is further provided with the scattering layer 5. The surface of the scattering layer 5 is a rough surface, and the Root-Mean-Square (RMS) value of the roughness of the rough surface ranges from 50 nm to 200 nm, so that rays may be scattered, and furthermore, the light emergent efficiency of the display panel is effectively increased. Based on the above, the above-mentioned display panel is relatively high in light emergent efficiency and relatively good in display effect.

Figure 2:
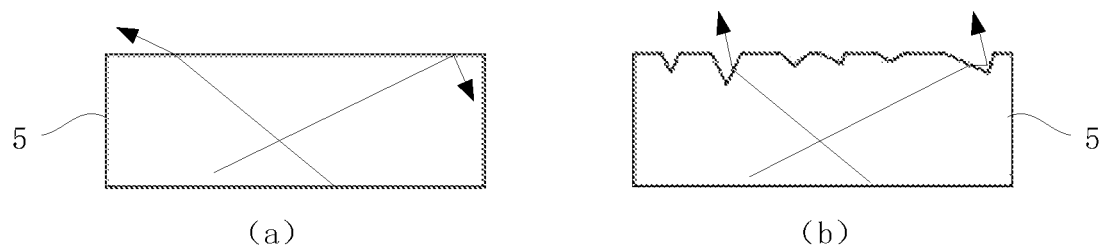
FIG. 2 is a schematic diagram of emergent light paths of rays passing through a scattering layer in two cases that the surface of the scattering layer is smooth and the surface of the scattering layer is rough.

The surface of the scattering layer 5 is a rough surface. Known by comparing two scattering layers 5, i.e., (a) and (b) in FIG. 2, the rough surface of the scattering layer 5 may avoid total reflection of the rays on the surface and increase the light emergent rate of the rays and meanwhile may also improve the refraction effect of the rays on the surface of the scattering layer 5, enhance the converging effect of the rays in an emergent process and increase the front light emergent rate.

Figure 3:
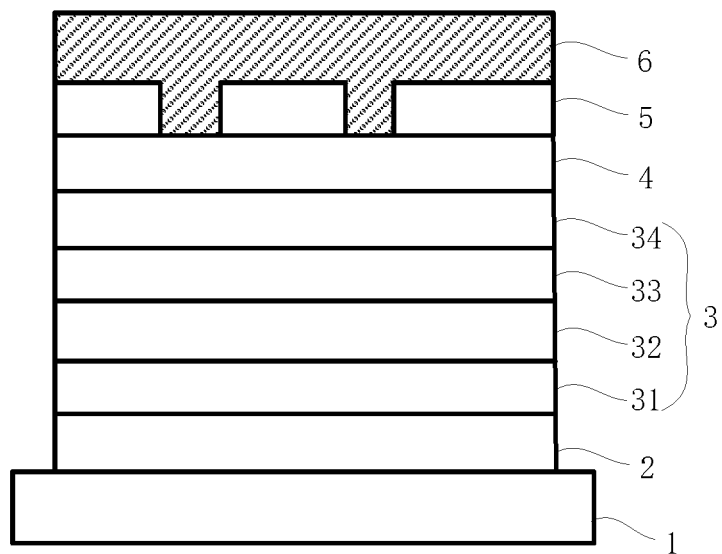
FIG. 3 is a schematic diagram of a sectional structure of a display panel provided by an embodiment of the present disclosure.
Figure 4:
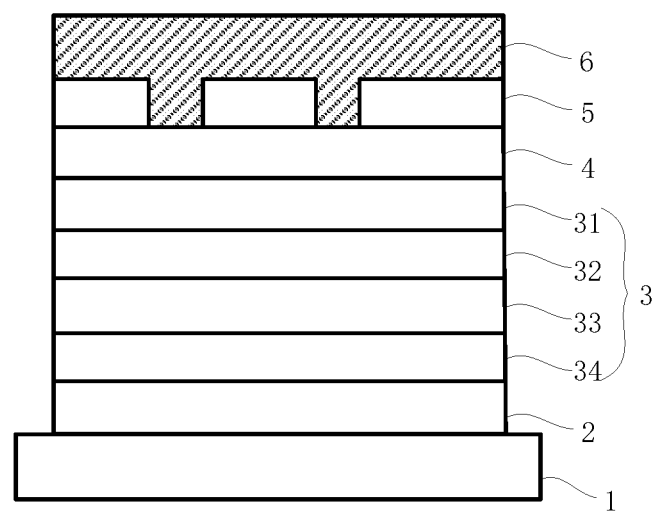
FIG. 4 is a schematic diagram of a sectional structure of a display panel provided by an embodiment of the present disclosure.
Figure 5:
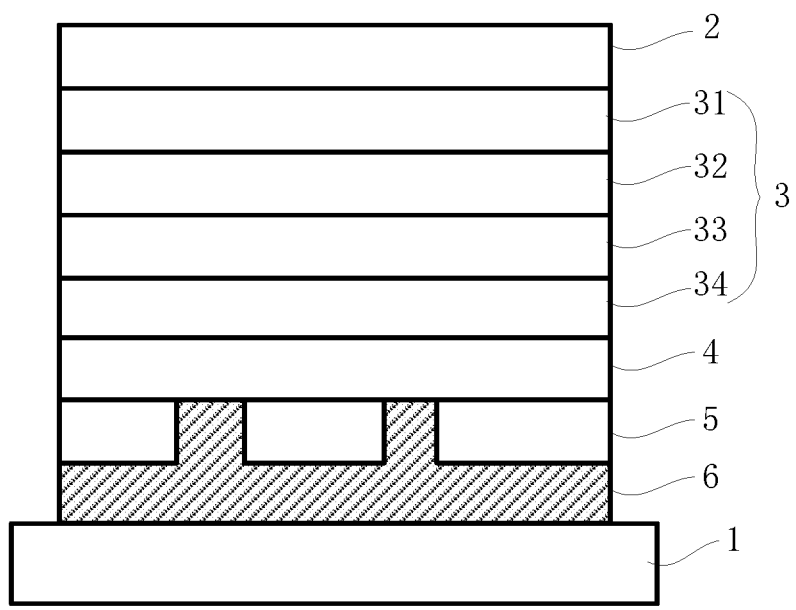
FIG. 5 is a schematic diagram of a sectional structure of a display panel provided by an embodiment of the present disclosure.
Figure 6:
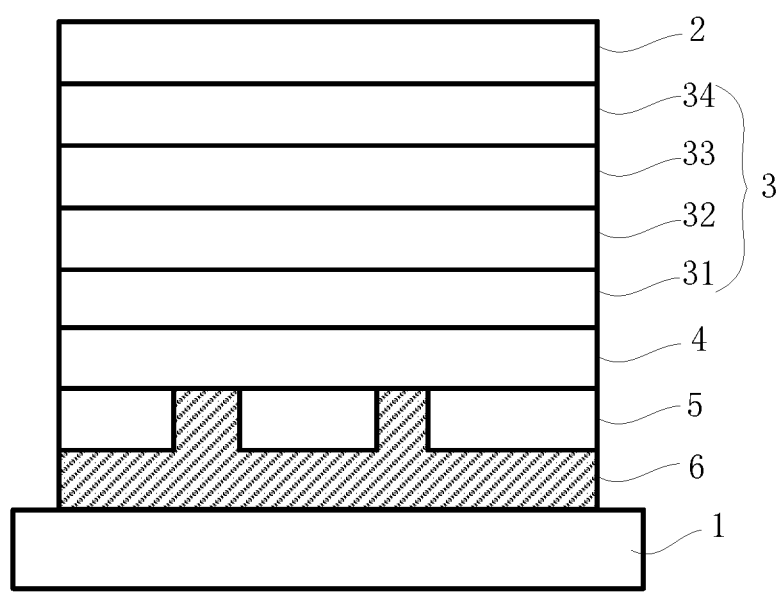
FIG. 6 is a schematic diagram of a sectional structure of a display panel provided by an embodiment of the present disclosure.

Optionally, the display panel provided by the embodiment of the present disclosure may be a top emission device or a bottom emission device. Specifically, the display panel includes the substrate 1, if the display panel is the top emission device, as shown in FIG. 1, FIG. 3 and FIG. 4, the substrate 1 is arranged close to the first electrode 2; and if the display panel is the bottom emission device, as shown in FIG. 5 and FIG. 6, the substrate 1 is arranged close to the scattering layer 5.

In an embodiment, the refractive index of the scattering layer 5 is greater than that of the second electrode 4.

In the related art, take the top emission device as an example, the refractive index of a top semitransparent cathode (a thin film made of a metal such as Al and Ag) is greater than that of air, and the rays are easy to reflect on the cathode so that parts of the rays may not be emitted from the cathode. In the embodiment of the present disclosure, the scattering layer 5 with the higher refractive index is provided on the surface of the second electrode 4, so that the phenomenon that the rays may not be emitted due to total reflection of the rays on an interface of the second electrode 4 and the scattering layer 5 may be prevented, and therefore, the emitting efficiency may be further increased.

Exemplarily, the second electrode 4 is a transparent electrode and is made of a material such as indium tin oxide (ITO) and indium zinc oxide (IZO) with the refractive index being about 1.7 to 1.9.

Exemplarily, the refractive index of the material of the scattering layer 5 may be 2 to 2.5.

Exemplarily, the material of the scattering layer may include an inorganic material such as oxides and nitrides and may also include an organic material such as a macromolecular polymer. For example, the scattering layer 5 may be made of an inorganic insulating material such as $SiN_x$, $SiON_x$, $TiO_x$, $ZrO_x$ and $HfO_x$ and may also be made of an organic material such as PMMA.

In some embodiments, as shown in FIG. 1, and FIG. 3 to FIG. 6, the scattering layer 5 is of patterned array structures; the display panel further includes a third electrode 6 (the shaded parts shown in FIG. 1, FIG. 3, and FIG. 4 to FIG. 6) located at one side of the scattering layer 5 away from the second electrode 4; and the third electrode 6 is connected with the second electrode 4 through a gap among the array structures, and the third electrode 6 and the second electrode 4 jointly form an electrode structure at the light emergent side of the display panel so that the resistance of the electrode at the light emergent side may be effectively reduced, and the performance of a light emitting device may be improved.

In some implementations, the work function of the third electrode 6 is greater than that of the second electrode 4, and the light transmissivity of the third electrode 6 is greater than that of the second electrode 4.

Exemplarily, as shown in FIG. 3 and FIG. 5, the first electrode 2 is configured as an anode, and the second electrode 4 and the third electrode 6 are configured as cathodes; and the light emitting structure 3 includes a hole injection layer (HI) 31, a hole transport layer (HT) 32, a quantum dot light emitting layer (QD) 33 and an electron transport layer (ET) 34 sequentially arranged in a direction from the first electrode 2 to the second electrode 4. Optionally, as shown in FIG. 3 and FIG. 5, the second electrode 4 is in contact with the electron transport layer 34, and the work function of the second electrode 4 is matched with the energy level of the electron transport layer 34.

The work function of the second electrode is matched with the energy level of the electron transport layer, which may be understood as that the work function of the second electrode is approach to a numerical value of the HOMO energy level of the electron transport layer, and a difference value thereof is generally not greater than 0.3 eV, for example, the difference value of the work function of the second electrode and the HOMO energy level of the electron transport layer may be 0 eV, 0.1 eV, 0.2 eV or 0.3 eV.

Exemplarily, the hole injection layer 31 may be made of an organic injection material such as PEDOT:PSS or an inorganic oxide such as $MoO_x$. The hole transport layer 32 may be made of an organic transport material such as PVK, TFB and TPD or an inorganic oxide such as $NiO_x$ and $VO_x$. The electron transport layer 34 may select ZnO nanoparticles or Mg-doped ZnO nanoparticles. Exemplarily, the second electrode 4 and the third electrode 6 are made of the same material and may be a high-transmissivity electrode prepared by adopting a magnetron sputtering process. Optionally, the second electrode 4 and the third electrode 6 are made of an indium zinc oxide (IZO) material. In a preparation process, the indium zinc oxide (IZO) electrode is directly deposited to be formed by adopting a magnetron sputtering way without undergoing an annealing process, so that influences on an electrode layer on a lower layer may be avoided.

Exemplarily, the work function of the second electrode 4 is relatively low, is about 4.2 eV-4.4 eV and is approach to the energy level of a conduction band of the electron transport layer 34, an electron injection barrier is relatively proper, but the transmissivity of the second electrode is relatively low and is about 40%; and the third electrode 6 may achieve high transmissivity of 90% or above by adopting an oxygen doping process and has the work function of about 5.6 eV. Specifically, in an embodiment of the present disclosure, the cathode structurally includes two layers including the third electrode 6 and the second electrode 4, so that the resistance of the cathode may be effectively reduced, and the performance of the light emitting device may be improved. Meanwhile, the second electrode 4 is in contact with the electron transport layer 34, and the energy level of the second electrode 4 is matched with that of the electron transport layer 34 so that the performance of the light emitting device may be further guaranteed. In addition, the second electrode 4 may select a process in which no oxygen is doped in an IZO sputtering process according to a requirement that the work function of the second electrode 4 is matched with the energy level of the electron transport layer 34 (such as a ZnO layer), then the transmissivity of the second electrode 4 prepared is relatively low, while the third electrode 6 is away from the electron transport layer 34, so that an oxygen-doping sputtering process by which high transmissivity may be realized may be selected, and the transmissivity is relatively high; and in the embodiment of the present disclosure, through the two-layer structure of the third electrode 6 and the second electrode 4, not only may the performance of the light emitting device be guaranteed, but also the transmissivity of the electrode structure at the overall light emergent side may be increased.

Exemplarily, as shown in FIG. 3 and FIG. 5, the thickness of the third electrode 6 is greater than that of the second electrode 4.

In the embodiments of the present disclosure, the thickness of the third electrode 6 with relatively high transmissivity is greater than that of the second electrode 4 with relatively low transmissivity, so that the transmissivity of the electrode structure at the overall light emergent side may be further increased under the condition that the performance of the light emitting device is guaranteed.

Exemplarily, the thickness of the second electrode 4 may be 10 nm-100 nm. The thickness of the third electrode 6 is greater than 100 nm and may be specifically determined according to an actual demand.

In another optional implementation, as shown in FIG. 4 and FIG. 6, the first electrode 2 is configured as a cathode, and the second electrode 4 is configured as an anode; the light emitting structure 3 includes an electron transport layer 34, a quantum dot light emitting layer 33, a hole transport layer 32 and a hole injection layer 31 sequentially arranged in a direction from the first electrode 2 to the second electrode 4; the second electrode 4 is in contact with the hole injection layer 31, and the work function of the second electrode 4 is matched with the energy level of the hole injection layer 31, namely the work function of the second electrode 4 is approach to a numerical value of the HOMO energy level of the hole injection layer 31, and a difference value thereof is generally not greater than 0.3 eV, for example, the difference value of the work function of the second electrode and the HOMO energy level of the hole injection layer may be 0 eV, 0.1 eV, 0.2 eV or 0.3 eV. Optionally, the second electrode 4 may be made of an indium zinc oxide (IZO) material, the work function of the second electrode 4 is approach to the HOMO energy level of the hole injection layer 31 and is a greater numerical value, and high transmissivity of 90% or above may be achieved by adopting an oxygen-doping sputtering process. In this condition, the thickness of the second electrode 4 may be set to be greater to improve the performance of the anode, meanwhile, the brightness of emergent light may not be greatly affected, and furthermore, in some embodiments, the third electrode may be omitted.

In some embodiments, the scattering layer 5 is of a structure of photonic crystals, filtration and light extraction may be realized through the scattering layer 5, then the light emergent efficiency and front light emergent efficiency of the display panel may be further increased.

A structure of photonic crystals refers to an artificial periodic dielectric structure with a photonic band-gap (PBG for short) characteristic, in other words, the structure of photonic crystals is of a periodic array structure, and the dimension in each period is the lattice dimension of the photonic crystal and determines the filtered and extracted light wavelength.

Exemplarily, the display panel includes sub-pixels with different colors, and the lattice dimension of the photonic crystal of the scattering layer 5 and the wavelength of light correspondingly output by each sub-pixel are within the same dimension magnitude range and are both nanoscale. Specifically, the display panel includes a red pixel, a green pixel and a blue pixel, and lattice dimensions of photonic crystals in the red pixel, the green pixel and the blue pixel respectively range from 150 nm to 200 nm, from 250 nm to 300 nm and from 350 nm to 400 nm.

Figure 7:
FIG. 7 is a schematic diagram of a scattering layer provided by an embodiment of the present disclosure.

Exemplarily, as shown in FIG. 7, the thickness of the scattering layer 5 (the thickness of the photonic crystal) may be 50 nm-500 nm.

Of course, as shown in FIG. 7, the array structures of the scattering layer 5 may also adopt array patterns with randomly distributed shapes and dimensions, rather than the periodic photonic crystal structures.

In addition, exemplarily, in the embodiments of the present disclosure, the substrate 1 may be a glass or flexible PET substrate, and the first electrode 2 may be a transparent electrode made of an indium tin oxide (ITO), a fluorine-doped tin oxide (FTO) or a conductive polymer or a non-transparent electrode made of a metal such as Al and Ag, which may be specifically determined according to an actual demand.

Moreover, an embodiment of the present disclosure further provides a display device which may include any one of the above-mentioned display panel.

Optionally, the display device in the embodiment of the present disclosure may be a top emission quantum dot light emitting diode display device (QLED) and may be specifically used for a television, a display, a notebook computer and a tablet personal computer.

Based on the display panel provided by the embodiments of the present disclosure, the present disclosure further provides a method for preparing the display panel.

The method for preparing the display panel includes respectively preparing a first electrode, a light emitting structure, a second electrode and a scattering layer. The first electrode, the light emitting structure, the second electrode and the scattering layer are stacked in sequence. The second electrode is a transparent electrode. One side of the scattering layer away from the second electrode is configured as a light emergent side. The surface of the one side of the scattering layer away from the second electrode is a rough surface, and the RMS of the roughness of the rough surface is 50 nm-200 nm.

Optionally, the operation of preparing the scattering layer include:

depositing a scattering layer material; and roughening a surface of one side of the scattering layer material away from the second electrode by using a plasma etching process or a sand blasting process to make the RMS of the roughness of the surface be 50 nm-200 nm.

In some embodiments, the method further include:

forming patterned array structures for the scattering layer by using a patterning process; and forming a third electrode on the scattering layer, wherein the third electrode is connected with the second electrode through a gap among the patterned array structures, the work function of the third electrode is greater than that of the second electrode, and the light transmissivity of the third electrode is greater than that of the second electrode.

In some embodiments, the operations of preparing the scattering layer and forming the patterned array structures for the scattering layer by using the patterning process may include: depositing an oxide material layer or a nitride material layer by adopting a PECVD process, and forming the patterned array structures by using a photolithographic process (including operations such as photoresist coating, developing, etching and stripping).

In some embodiments, the operations of preparing the scattering layer and forming the patterned array structures for the scattering layer by using the patterning process may include: preparing a PMMA material layer by adopting a wet film forming process, and forming the patterned array structures by using a nano-imprinting process.

In some embodiments, the second electrode and the third electrode may be respectively deposited in a way of sputtering the IZO.

Exemplarily, the operation of forming the light emitting structure may include: sequentially preparing a hole injection layer (HI), a hole transport layer (HT), a quantum dot light emitting layer (QD) and an electron transport layer (ET).

Exemplarily, the method for preparing the display panel provided by the present disclosure may further include operations such as forming a pixel defining layer and forming a packaging layer, the descriptions thereof are omitted herein.

Obviously, the skilled in the art can make various alterations and variations on the embodiments of the present disclosure without departing from the spirit and scope of the present disclosure. In this way, if the alterations and variations of the present disclosure fall within the scopes of the claims of the present disclosure and their equivalent technologies, the present disclosure is also intended to include the alterations and variations.

What is claimed is:

1. A display panel, comprising a first electrode, a light emitting structure, a second electrode and a scattering layer stacked in sequence; wherein,
    the second electrode is a transparent electrode;
    one side of the scattering layer away from the second electrode is configured as a light emergent side;
    a surface of the one side of the scattering layer away from the second electrode is a rough surface, and a Root-Mean-Square (RMS) value of roughness of the rough surface ranges from 50 nm to 200 nm; and
    a refractive index of the scattering layer is greater than that of the second electrode.

2. The display panel according to claim 1, wherein the scattering layer is of patterned array structures; and
    the display panel further comprises:
        a third electrode located at the one side of the scattering layer away from the second electrode; wherein,
        the third electrode is connected with the second electrode through a gap among the patterned array structures;
        a work function of the third electrode is greater than that of the second electrode; and
        a light transmissivity of the third electrode is greater than that of the second electrode.

3. The display panel according to claim 2, wherein:
    the first electrode is configured as an anode, and the second electrode and the third electrode are configured as cathodes;
    the light emitting structure comprises a hole injection layer, a hole transport layer, a quantum dot light emitting layer and an electron transport layer sequentially arranged in a direction from the first electrode to the second electrode; and
    the second electrode is in contact with the electron transport layer, and the work function of the second electrode is matched with an energy level of the electron transport layer.

4. The display panel according to claim 2, wherein the second electrode and the third electrode are made of the same material.

5. The display panel according to claim 4, wherein the second electrode and the third electrode are made of an indium zinc oxide material.

6. The display panel according to claim 2, wherein a thickness of the third electrode is greater than that of the second electrode.

7. The display panel according to claim 6, wherein the thickness of the second electrode ranges from 10 nm to 100 nm.

8. The display panel according to claim 1, wherein,
    the first electrode is configured as a cathode, and the second electrode is configured as an anode;
    the light emitting structure comprises an electron transport layer, a quantum dot light emitting layer, a hole transport layer and a hole injection layer sequentially arranged in a direction from the first electrode to the second electrode; and
    the second electrode is in contact with the hole injection layer, and a work function of the second electrode is matched with an energy level of the hole injection layer.

9. The display panel according to claim 1, wherein,
    the scattering layer is of a structure of photonic crystals; and
    the display panel comprises a red pixel, a green pixel and a blue pixel, and lattice dimensions of photonic crystals in the red pixel, the green pixel and the blue pixel respectively range from 150 nm to 200 nm, from 250 nm to 300 nm and from 350 nm to 400 nm.

10. The display panel according to claim 1, wherein a material of the scattering layer comprises at least one of: oxides, nitrides and macromolecular polymers.

11. The display panel according to claim 10, wherein the material of the scattering layer comprises at least one of: $SiN_x$, $SiON_x$, $TiO_x$, $ZrO_x$, $HfO_x$ and Polymethyl Methacrylate (PMMA).

12. A display device, comprising the display panel according to claim 1.

13. A method for preparing a display panel according to claim 1, comprising:
    respectively preparing the first electrode, the light emitting structure, the second electrode and the scattering layer; wherein,
    the first electrode, the light emitting structure, the second electrode and the scattering layer are stacked in sequence;
    the second electrode is a transparent electrode;
    one side of the scattering layer away from the second electrode is configured as a light emergent side;
    a surface of the one side of the scattering layer away from the second electrode is a rough surface, and a Root-Mean-Square (RMS) value of roughness of the rough surface ranges from 50 nm to 200 nm; and
    a refractive index of the scattering layer is greater than that of the second electrode.

14. The method according to claim 13, wherein the preparing the scattering layer comprises:
    depositing a scattering layer material; and
    roughening a surface of one side of the scattering layer material away from the second electrode by using a plasma etching process or a sand blasting process to make the RMS of the roughness of the surface range from 50 nm to 200 nm.

15. The method according to claim 13, further comprising:
    forming patterned array structures for the scattering layer by using a patterning process; and
    forming a third electrode on the scattering layer, wherein the third electrode is connected with the second electrode through a gap among the patterned array structures, a work function of the third electrode is greater than that of the second electrode, and a light transmissivity of the third electrode is greater than that of the second electrode.

16. The method according to claim 15, wherein the preparing the scattering layer and the forming the patterned array structures for the scattering layer by using the patterning process comprise:

depositing an oxide material layer or a nitride material layer by adopting a Plasma Enhanced Chemical Vapor Deposition (PECVD) process, and forming the patterned array structures by using a photolithographic process;

or preparing a Polymethyl Methacrylate (PMMA) material layer by adopting a wet film forming process, and forming the patterned array structures by using a nano-imprinting process.

* * * * *